United States Patent [19]

Inadachi

[11] 4,130,896
[45] Dec. 19, 1978

[54] PERIPHERAL CIRCUIT IN A MEMORY SYSTEM

[75] Inventor: Masaaki Inadachi, Kokubunji, Japan

[73] Assignee: Hitachi, Ltd., Japan

[21] Appl. No.: 773,418

[22] Filed: Mar. 1, 1977

[30] Foreign Application Priority Data

Mar. 5, 1976 [JP] Japan .................................. 51-23322

[51] Int. Cl.² ............................................ G11C 11/40
[52] U.S. Cl. ..................................... 365/203; 307/238
[58] Field of Search ..... 340/173 R, 173 CA, 173 FF; 365/203

[56] References Cited

U.S. PATENT DOCUMENTS

| 3,760,381 | 2/1973 | Yao .................................... 340/173 R |
| 3,902,082 | 8/1975 | Proebsting et al. ............... 340/173 R |
| 4,027,294 | 5/1977 | Meusburger ..................... 340/173 R |

Primary Examiner—Terrell W. Fears
Attorney, Agent, or Firm—Craig & Antonelli

[57] ABSTRACT

A peripheral circuit in a memory system comprising an address buffer circuit, a driver circuit and a control circuit includes two precharge signal generating circuits, one for supplying a precharge signal to the address buffer circuit and the other for supplying a precharge signal to the driver circuit and the control circuit.

3 Claims, 5 Drawing Figures

PERIPHERAL CIRCUIT IN A MEMORY SYSTEM

BACKGROUND OF THE INVENTION

The present invention relates to a peripheral circuit in a memory system.

In a dynamic memory system, the output of a peripheral circuit such as an address buffer circuit or a driver circuit is reduced to zero volt (for an N-channel system) by an inverted external clock signal, i.e., by a so-called precharge signal prior to the initiation of the readout or write operations, i.e. in a stand-by period. When the external clock changes from zero volt to a high voltage (power supply voltage $V_D$), the memory system is rendered operative but the peripheral circuit does not operate even after the external clock has changed to the high voltage until the precharge signal becomes zero volt.

The precharge signal necessarily includes a delay time because it is generated by the external clock in an IC chip.

The delay time of the prior art precharge signal generating circuit amounts to 20–30 nanoseconds because only one precharge signal generating circuit has been used to precharge all of the peripheral circuits in the IC chip.

It is an address buffer circuit which is operated first on the peripheral circuit that poses a critical problem due to the delay time because such delay time is directly added to the delay time of the address buffer circuit resulting in the increase in an access time and blocking the realization of a high speed system.

SUMMARY OF THE INVENTION

It is an object of the present invention to provide a peripheral circuit in a memory system which makes it possible to reduce the delay time for an inverted external clock signal supplied to the peripheral circuit to attain high speed operation of the peripheral circuit for reducing the access time of the memory system.

In order to achieve the above object, the present invention is characterized in that an inverted signal generating circuit is divided into a plurality of sub-circuits so that each of the sub-circuits supplies an inverted signal to a corresponding section of the peripheral circuit.

The periperal circuit operating as a load circuit to the inverted signal generating circuit comprises a first circuit section in which the inverted signal has a significant effect on the access time and a second circuit section in which the inverted signal has little effect on the access time, and the first circuit section has a relatively small load capacitance while the second section forms a large portion of the total load capacitance. According to the present invention, separate inverted signal generating circuits are provided to supply inverted signals to the first and second circuit sections so that a high speed operation is attained in the first circuit section in which the inverted signal has the significant effect on the access time. This is based on the fact that the driving speed of the peripheral circuit by the inverted signal generating circuit depends on both a gm of a transistor in the generating circuit and a load capacitance C and it is more effective to reduce the load capacitance than to increase gm in order to drive the capacitive load at a higher speed.

BRIEF DESCRIPTON OF THE DRAWINGS

DETAILED DESCRIPTION OF THE PREFERRED EMBODIMENTS

Figure 1:
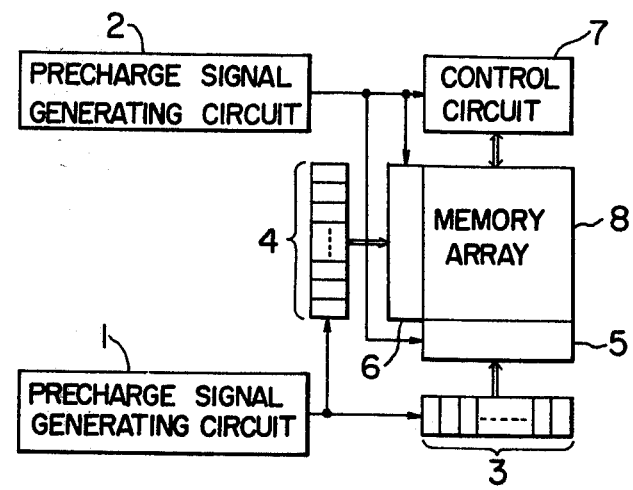
FIG. 1 shows a schematic diagram of one embodiment of a peripheral circuit in a memory system in accordance with the present invention.

FIG. 1 shows an embodiment of a peripheral circuit in a memory system in accordance with the present invention, in which numerals 1 and 2 denote precharge signal generating circuits, 3 and 4 denote word and digit address buffer circuits, respectively, 5 and 6 denote word and digit driver circuits, respectively, 7 denotes a control circuit and 8 denotes a memory array.

The characteristic feature of the circuit arrangement of FIG. 1 resides in that the plurality of precharge signal generating circuits 1 and 2 are provided so that the precharge signal generating circuit 1 supplies a precharge signal to the address buffer circuits 3 and 4 which directly relate to the access time and the precharge signal generating circuit 2 supplies a precharge signal to the driver circuits 5 and 6 and the control circuit 7 which do not directly relate to the access time.

The address buffer circuits 3 and 4 in the peripheral circuit operate first so that the access time is directly affected therein by the precharge signal. Furthermore, they have very small capacitances. On the other hand, the other parts of the peripheral circuit, that is, the driver circuits 5 and 6 including decoders and the control circuit 7 operate after the operation of the address buffer circuits 3 and 4 and therefore the access time is not directly affected therein by the precharge signal. Furthermore, they have relatively large capacitances. Accordingly, as described above, by precharging only the address buffer circuits 3 and 4 by the separate precharge signal generating circuit 1, it is possible to reduce the load capacitance to the generating circuit 1 to a very small value and hence reduce the delay time to a very short time in order to attain a high speed operation of the address buffer circuits and the reduction of the access time.

Figure 2:
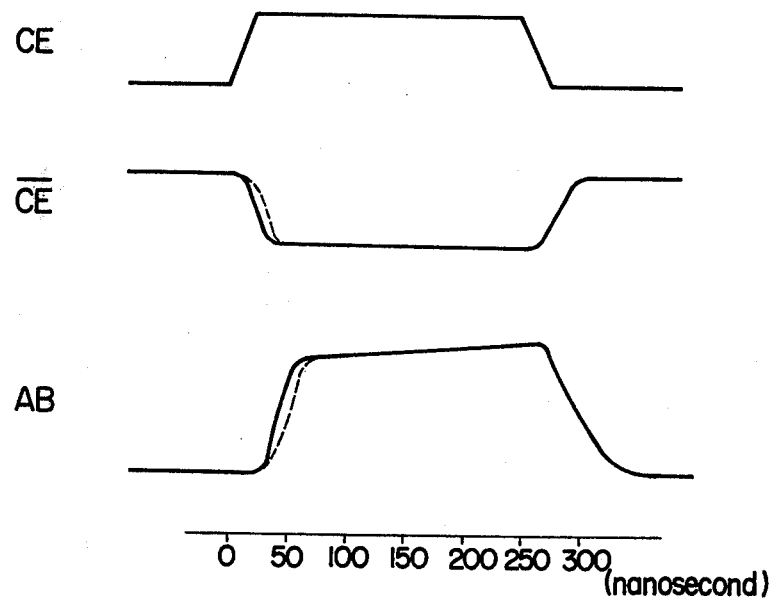
FIG. 2 shows waveforms for explaining the operation of the circuit of FIG. 1.

FIG. 2 shows waveforms which illustrate the above effect, in which CE represents an external clock, $\overline{CE}$ represents a precharge signal and AB represents an output waveform of the address buffer circuit. These waveforms correspond to a 16 K-bit memory in the illustrated example. In the waveforms $\overline{CE}$ and AB, the solid lines show the waveforms by the present invention and the broken lines show the waveforms derived when only a single generating circuit is used as in the prior art. As seen from FIG. 2, the delay time of the address buffer circuit in the prior art system is 50 nanoseconds while that of the present circuit is reduced to 40 nanoseconds attaining the high speed operation. The reduction of the delay time of 10 nanoseconds directly leads to the reduction of the access time.

Taking the fact that the shortest access time of the recent memory system is 100 nanoseconds or less into consideration, the reduction of 10 nanoseconds in the delay time corresponds to the reduction of 10% or more of the overall access time and hence this is very effective in realizing a high speed memory system.

Figure 3:
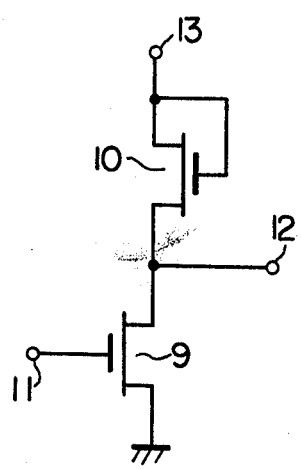
FIG. 3 shows a schematic diagram of an embodiment of a precharge signal generating circuit shown in FIG. 1.

FIG. 3 shows a particular embodiment of the precharge signal generating circuit shown in FIG. 1, which comprises two MOS transistors 9 and 10, an input signal terminal 11, an output signal terminal 12 and a power supply terminal 13. A gate of the MOS transistor 9 is connected to the input signal terminal 11, a source thereof is grounded and a drain thereof is connected to an output signal terminal 12. Gate and drain of the MOS transistor 10 are connected together to the power supply terminal 13 and a source thereof is connected to the drain of the MOS transistor 9.

It should be understood that the precharge signal generating circuit need not be limited to the specific circuit illustrated but a conventional inverter circuit may be used in place of it.

Figure 4:
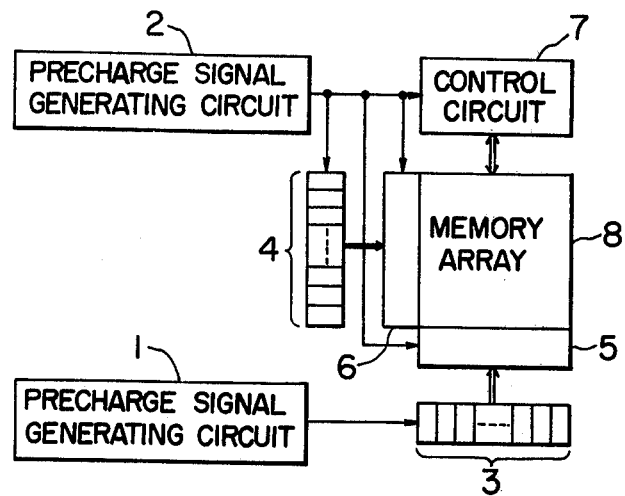
FIGS. 4 and 5 show schematic diagrams of other embodiments of the peripheral circuit of the present invention.

FIG. 4 shows a schematic diagram of another embodiment of the peripheral circuit of the present invention. In FIG. 4, numerals 1 and 2 denote precharge signal generating circuits as shown in FIG. 3. The memory array 8 includes memory cells for outputting stored signals to digit lines in response to predetermined signals on word lines. The word address buffer circuit 3 outputs internal address signals in response to external address signals and is disabled when a precharge signal from the precharge signal generating circuit 1 is applied thereto. The digit address buffer circuit 4 outputs internal address signals in response to external address signals and is disabled when a precharge signal from the precharge signal generating circuit 2 is applied thereto. The word driver circuit 5 incorporates a decoder and selectively enables one of the word lines by decoding the internal address signals output from the word address buffer circuit 3. The digit driver circuit 6 incorporates a decoder and selectively enables one of the digit lines by decoding the internal address signals output from the digit address buffer circuit 4. The circuit of FIG. 4 differs from the embodiment of FIG. 1 in that the precharge signal generating circuit 1 supplies the precharge signal only to the word address buffer circuit 3 and the precharge signal generating circuit 2 supplies the precharge signal to the digit address buffer circuit 4.

Since the word address buffer circuit 3 usually operates earlier than the digit address buffer circuit 4, and hence it has a direct influence on the access time, a high speed operation can be attained by supplying the precharge signal to the word address buffer circuit by the separate generating circuit.

Figure 5:
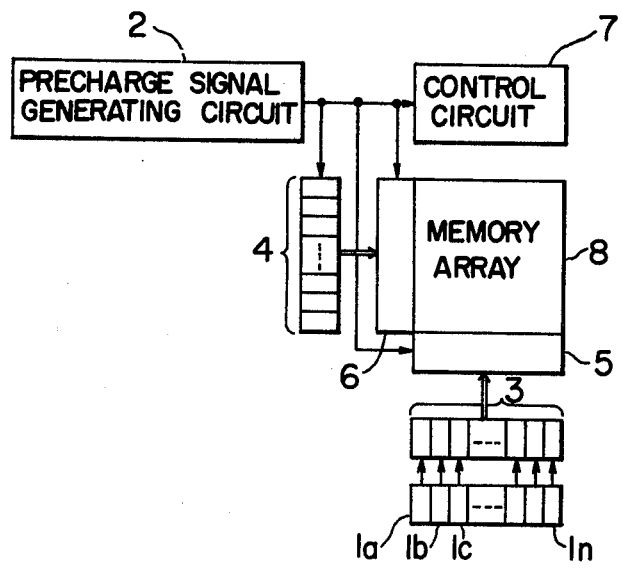

FIG. 5 shows a further embodiment of the peripheral circuit of the present invention.

It differs from the embodiment of FIG. 4 in that separate precharge signal generators 1a, 1b, 1c, ... 1n are provided for the respective bit positions of the word address buffer circuit 3. It should be understood that a higher operation is attained by this arrangement.

In FIG. 5, separate generating circuits may be provided for the respective bit positions of the digit address buffer circuit 4.

While two precharge signal generating circuits have been illustrated in the embodiments of FIGS. 1 and 4, three or more generating circuits may be provided, in which case a first generating circuit may be connected to the word address buffer circuit, a second generating circuit may be connected to the digit address buffer circuit and a third generating circuit may be connected to the remaining portions of the peripheral circuit. Alternatively, the first generating circuit may be connected to the two address buffer circuits, the second generating circuit may be connected to the decoders of the two drivers and the third generating circuit may be connected to the remaining portions of the peripheral circuit.

If there is a circuit other than the address buffer circuit which particularly influences the access time, the first generating circuit may be connected to that circuit. It should be understood that the present invention is applicable not only to the peripheral circuit which is driven by the precharge signal but to the peripheral circuit driven by any inverted external clock.

I claim:

1. A peripheral circuit in a memory system comprising:
   a plurality of word lines;
   a plurality of digit lines;
   memory means including a plurality of memory cells for outputting stored signals to a corresponding one of said digit lines in response to a predetermined signal on a corresponding one of said word lines;
   a first circuit for outputting a first precharge signal except when an external clock signal is applied thereto;
   a word address buffer circuit for outputting first internal address signals in response to first external address signals, said word address buffer circuit being disabled when said first precharge signal is applied thereto; and
   a word driver circuit connected to receive the output of said word address buffer circuit for selectively enabling one of said word lines by decoding said first internal address signals,
   wherein said first precharge signal is applied exclusively to said word address buffer circuit.

2. A peripheral circuit in a memory system according to claim 1, further comprising:
   a second circuit for outputting a second precharge signal except when said external clock signal is applied thereto;
   a digit address buffer circuit for outputting second internal address signals in response to second external address signals, said digit address buffer circuit being disabled when said second precharge signal is applied thereto; and
   a digit driver circuit for selectively enabling one of said digit lines by decoding said second internal address signals.

3. A peripheral circuit in a memory system according to claim 2, wherein said word address buffer circuit includes a plurality of buffer means for respectively outputting a respective one of said first internal address signals in response to a respective one of said first external address signals, said buffer means being disabled when said first precharge signal is applied thereto, and wherein said first circuit includes a plurality of means each of which outputs said first precharge signal except when said external clock signal is applied thereto, and said first precharge signals respectively output by said outputting means are respectively and exclusively supplied to a respective one of said buffer means.

* * * * *